(12) United States Patent
Chong et al.

(10) Patent No.: US 11,164,749 B1
(45) Date of Patent: Nov. 2, 2021

(54) WARPAGE REDUCTION

(71) Applicant: XILINX, INC., San Jose, CA (US)

(72) Inventors: Nui Chong, San Jose, CA (US);
Hui-Wen Lin, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/571,766

(22) Filed: Sep. 16, 2019

(51) Int. Cl.
    *H01L 21/302* (2006.01)
    *H01L 23/498* (2006.01)
    *H01L 21/67* (2006.01)
    *H01L 23/00* (2006.01)
    *H01L 29/78* (2006.01)

(52) U.S. Cl.
    CPC ...... *H01L 21/302* (2013.01); *H01L 21/67069* (2013.01); *H01L 21/67075* (2013.01); *H01L 23/49822* (2013.01); *H01L 23/562* (2013.01); *H01L 29/7843* (2013.01)

(58) Field of Classification Search
    None
    See application file for complete search history.

(56) References Cited

U.S. PATENT DOCUMENTS

| | | | |
|---|---|---|---|
| 5,387,555 A * | 2/1995 | Linn | H01L 21/2007 148/DIG. 12 |
| 9,006,030 B1 | 4/2015 | Kwon et al. | |
| 2014/0374879 A1* | 12/2014 | Chen | H01L 21/76802 257/532 |
| 2015/0017803 A1* | 1/2015 | Ning | H01L 23/481 438/667 |
| 2018/0026096 A1* | 1/2018 | Jacob | H01L 21/02381 257/622 |
| 2018/0068984 A1* | 3/2018 | Beyne | H01L 21/76877 |

* cited by examiner

*Primary Examiner* — Roberts P Culbert
(74) *Attorney, Agent, or Firm* — Patterson + Sheridan, LLP

(57) ABSTRACT

Examples described herein provide a method for reducing warpage when stacking semiconductor substrates. In an example, a first substrate is bonded with a second substrate to form a stack. The first substrate comprises a first semiconductor substrate, and the second substrate comprises a second semiconductor substrate. The second semiconductor substrate is thinned, and a first trench is etched into a backside of the thinned second semiconductor substrate. A first stressed material is deposited into the first trench.

19 Claims, 11 Drawing Sheets

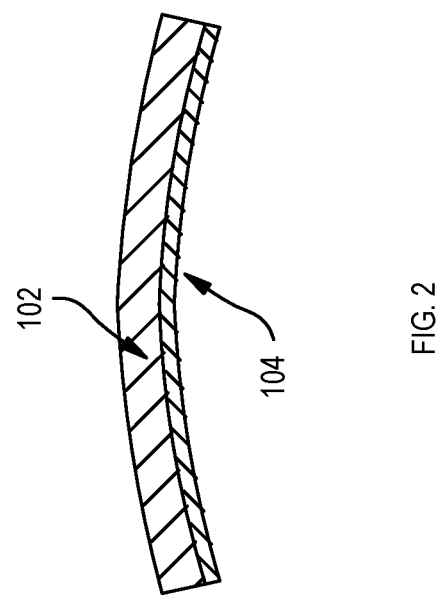
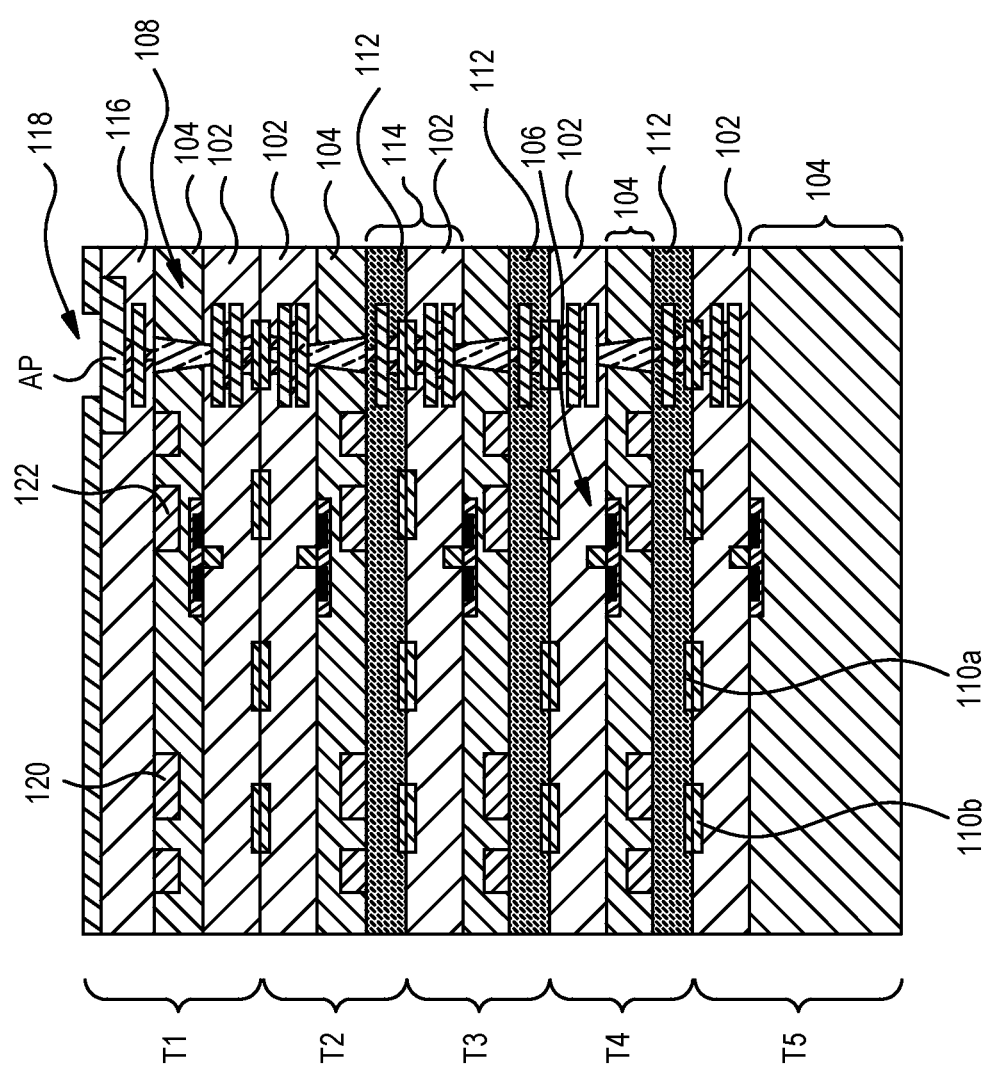

US 11,164,749 B1

WARPAGE REDUCTION

TECHNICAL FIELD

Examples of the present disclosure generally relate to semiconductor processing, and more particularly, to warpage reduction in semiconductor substrates (e.g., wafers).

BACKGROUND

Out of plane deformation, such as warpage and bending, of a wafer can be problematic for wafer-level bonding or packaging. Warpage of the wafer can occur because of different coefficient of thermal expansions (CTEs) and intrinsic stress of materials formed on the wafer, such as during thermal cycling. Such warpage of a wafer during a bonding process can lead to failure at the bonding interface, such as no-bonding (e.g., at edges), cracking, and/or delamination. Additionally, if further processing is performed on a wafer after bonding the wafer with another wafer, warpage of the wafer(s) can cause polishing and/or thinning non-uniformity and can cause photolithography misalignment. Each of these challenges can cause decreased yield.

SUMMARY

Examples described herein provide for stacking semiconductor substrates that reduces warpage of the semiconductor substrates. An example is a method. A first substrate is bonded with a second substrate to form a stack. The first substrate comprises a first semiconductor substrate, and the second substrate comprises a second semiconductor substrate. The second semiconductor substrate is thinned, and a first trench is etched into a backside of the thinned second semiconductor substrate. A first stressed material is deposited into the first trench.

Another example is an apparatus. The apparatus comprises a first substrate having a first semiconductor substrate and a second substrate having a second semiconductor substrate. The second substrate is bonded to the first substrate, and the second semiconductor substrate comprises a first stressed material disposed in trenches on a backside of the second semiconductor substrate.

Another example is an apparatus. An apparatus comprises a first substrate having a first semiconductor substrate, and a second substrate having a second semiconductor substrate. A surface of the second substrate is bonded to the first substrate, and the second semiconductor substrate comprises a first stressed material disposed in trenches on a side of the second semiconductor substrate opposite from the surface of the second substrate bonded to the first substrate.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 1 is a cross-sectional view of a multi-die stack, according to some examples.

FIG. 2 is a cross-sectional view of a warped substrate.

To facilitate understanding, identical reference numerals have been used, where possible, to designate identical elements that are common to the figures. It is contemplated that elements of one example may be beneficially incorporated in other examples.

DETAILED DESCRIPTION

Figure 3A:
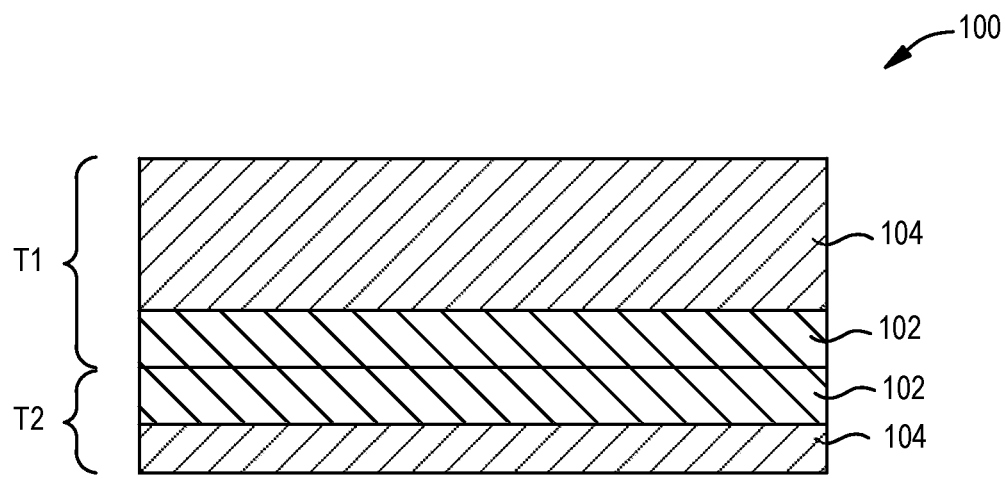
FIGS. 3A-3D are cross-sectional views of processing of bonded substrates, according to some examples

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example does not need to have all the aspects or advantages shown. An aspect or an advantage described in conjunction with a particular example is not necessarily limited to that example and can be practiced in any other examples even if not so illustrated, or if not so explicitly described.

Examples herein relate to warpage reduction techniques. The techniques disclosed herein can reduce warpage of substrates, such as wafers. As described herein, the warpage reduction techniques can involve bonding two substrates together to form a stack, where each of the two substrates is or includes a semiconductor substrate. One of the semiconductor substrates may be thinned and then trenches may be etched into the thinned semiconductor substrate. A stressed material may be deposited into the trenches of the thinned semiconductor substrate. The stressed material may have an intrinsic stress, such as compressive or tensile, in order to reduce warpage. The stressed material may also be or include a material having a different coefficient of thermal expansion (CTE) of the semiconductor substrate such that the stressed material can cause stress during thermal cycling. By etching trenches into the thinned semiconductor substrates and depositing stressed material therein, the stressed material in the trenches can reduce warpage of the substrate. A wafer can have any shape for a front side surface (as described further below), such as substantially circular, substantially rectangular or square, or another shape.

The warpage reduction techniques disclosed herein can be used with stacked devices, such as including active-on-active (AoA) dies. The process of making a device including AoA dies can include bonding and thinning multiple substrates or wafers, from which warpage can develop due to multiple thermal cycles. Accordingly, by applying the warpage reduction techniques disclosed herein for forming a device comprising AoA dies, warpage can be reduced.

FIG. 1 is a cross-sectional view of a multi-die stack (also referred to more generically as bonded substrates), according to some examples. The multi-die stack includes five dies T1-T5 for illustrative purposes, but can include any number of dies. Each die T1-T5 includes a semiconductor substrate 104 and one or more front side dielectric layers 102 on a front side of the semiconductor substrate 104. One or more devices (e.g., a transistor 106) are formed in and/or on the semiconductor substrate 104 of each die T1-T5. The devices in and/or on the semiconductor substrate 104 of a die T1-T5 can be interconnected to form an active integrated circuit on the respective die T1-T5. The side of the respective semiconductor substrate 104 in and/or on which, e.g., transistor 106 is formed is referred to as the front side merely for convenience herein, whereas the opposite side of the respective semiconductor substrate is referred to as the backside merely for convenience herein. Front side and backside may merely be convenient terms to refer to opposite sides of a substrate. Metal lines and vias are formed in and/or through the front side dielectric layers 102 to interconnect the one or more devices, which can form, at least in part, an integrated circuit of the respective die. Contacts 110a are formed at a surface of the front side dielectric layers 102 distal from the respective semiconductor substrate 104.

Each die T1-T4 further includes backside through-substrate vias (BTSVs) 108 through the respective semiconductor substrate 104 and includes one or more backside dielectric layers 112, 116. Metal lines and vias are formed in and/or through the backside dielectric layers 112, 116 to connect with the BTSVs 108. Contacts 110b are formed at a surface of the backside dielectric layers 112 distal from the respective semiconductor substrate 104.

The dies T1-T5 are bonded together (e.g., using hybrid bonding, such as oxide-to-oxide bonding and metal-to-metal bonding) to form the multi-die stack. In the illustrated example, the dies T2-T5 are bonded together by a front side (e.g., a front side dielectric layer 102 with contacts 110 thereon) of a die bonded to a backside (e.g., a backside dielectric layer 112 with contacts 110 thereon) of another die. Further, in the illustrated example, a front side (e.g., a front side dielectric layer 102 with contacts 110 thereon) of the die T2 is bonded to a front side (e.g., a front side dielectric layer 102 with contacts 110 thereon) of the die T1. In other examples, the bonding can be in any arrangement throughout the multi-chip stack, such as any permutation of front side to front side bonding, and/or front side to backside bonding.

In some examples, each of the semiconductor substrates 104 of the dies T1-T5 is or comprises silicon. In some examples, each of the semiconductor substrates 104 of the dies T1-T4 can be thinned during processing and can have a thickness of about 2 μm to about 3 μm.

In some examples, each substrate or die includes additional components for electrically connecting to the neighboring substrates or dies.

For a multi-die stack constructed using the warpage reduction techniques disclosed herein, one or more semiconductor substrate 104 of the dies T1-T4 includes stressed material 122 deposited into trenches 120 etched into the semiconductor substrate 104. The stressed material 122 can alleviate warpage of the respective semiconductor substrate 104 on which the stressed material 122 is formed, and correspondingly, can alleviate warpage of the wafer of which that semiconductor substrate 104 is a part after backside thinning of the semiconductor substrate 104. Further details about the warpage reduction techniques is provided with reference to FIGS. 3A-3D.

In some examples, the stressed material 122 is or includes a material of intrinsic stress deposited into the trenches 120. For example, a material of intrinsic stress can be a material having a different lattice constant as compared to a lattice constant of the semiconductor substrate 104. A material of intrinsic stress can also include a material having intrinsic stress that can be modulated based on process conditions, such as silicon nitride. In some examples, the stressed material 122 is or includes a material deposited into the trenches 120 having a different CTE than the semiconductor substrate 104. For example, thermal cycling can cause the stressed material 122 having a different CTE to cause various stresses in the semiconductor substrate 104 to alleviate warpage. Any combination of materials of intrinsic stress and materials having differing CTEs can be deposited into the trenches 120.

In some examples, one of the dies (e.g., die T1) comprises backside pads 118. Further, in some examples, the backside pads 118 are disposed in or on a backside dielectric layer 116 that is disposed on a backside of the semiconductor substrate 104 of die T1. In such examples, the die T1 is an input/output (IO) die, and can include additional components for such functionality.

FIG. 2 is a cross-sectional view of a warped substrate. During the process of making a multi-die stack, one or more front side dielectric layers 102 are deposited on the semiconductor substrate 104. The wafer, of which the semiconductor substrate 104 is a part, is bonded to another wafer and is thinned, e.g., by a chemical mechanical polish (CMP). In some examples, the semiconductor substrate 104 is thinned to a thickness of about 2 μm to about 3 μm. In some examples, the one or more front side dielectric layers 102 have a thickness of about 8 μm to about 10 μm.

Mismatching CTEs of materials of the semiconductor substrate 104 and the front side dielectric layers 102 can cause warpage, especially during bonding of the wafers where increased temperatures may be used during processing. Lower operation temperatures and fewer thermal cycles can reduce warpage. For a multi-chip stack having many dies, the process can implement more process steps as compared to a multi-chip stack having fewer dies. Accordingly, minor warpage can multiply, and yield issues, such as wafer edge no-bonding, polishing uniformity, or delamination, can occur if such challenges are not addressed. For example, after processing a stack of wafers, the accumulated warpage through multiple wafers stacking can be 200 μm above the plane formed by the wafer. Further, manufacturing issues, such as photolithography misalignment, can occur because of the warpage.

Warpage of a wafer can result in the exterior backside surface of the semiconductor substrate 104 being concave, such as illustrated in FIG. 2. Warpage of a wafer can also result in the exterior backside surface of the semiconductor substrate 104 being convex. In some examples, a wafer can include areas that have concave warpage and other areas that have convex warpage.

FIGS. 3A-3D are cross-sectional views of bonded substrates being processed using a warpage reduction technique, according to some examples. A person having ordinary skill in the art will readily understand that, at the processing of FIGS. 3A-3D, the dies T1-T5 of FIG. 1 usually have not been singulated from the wafers of which the dies T1-T5 form respective parts, although in some examples, various ones of the dies T1-T5 can be singulated at various times. For convenience, substrates T1-T5 used herein can refer to, e.g., respective dies T1-T5 and/or to respective wafers of which the dies T1-T5 form a part before being singulated. While FIGS. 3A-3D illustrate the warpage reduction techniques with substrate T1 and T2, the warpage reduction techniques disclosed herein can be used with any substrate used to form a multi-chip stack.

FIG. 3A is a cross-sectional view of bonded substrates 100 after substrate T1 and substrate T2 have been bonded together and the semiconductor substrate 104 of substrate T2 has been thinned. As mentioned, warpage of the bonded substrates 100 can occur because of the mismatching of CTEs between the front side dielectric layers 102 of substrate(s) T1 and/or T2 and the semiconductor substrate 104 of the substrate T2.

Figure 3B:
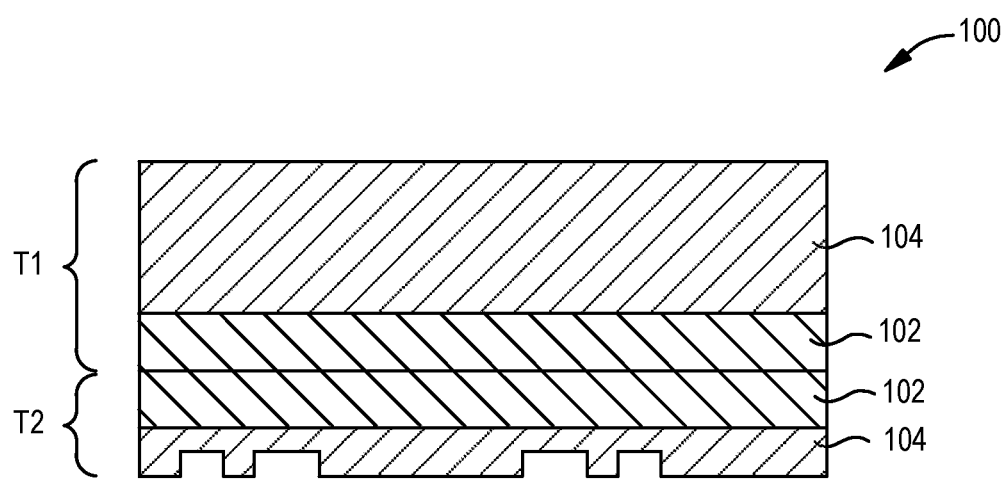

FIG. 3B is a cross-sectional view of the bonded substrates 100 including trenches 120 etched into the semiconductor substrate 104 of substrate T2. The trenches 120 can be formed in the semiconductor substrate 104 by dry (e.g., plasma) etching. Suitable etchants include halogens and halogen containing compounds. Wet etching or other suitable techniques may also be used. The trenches 120 can have any pattern.

Figure 3C:
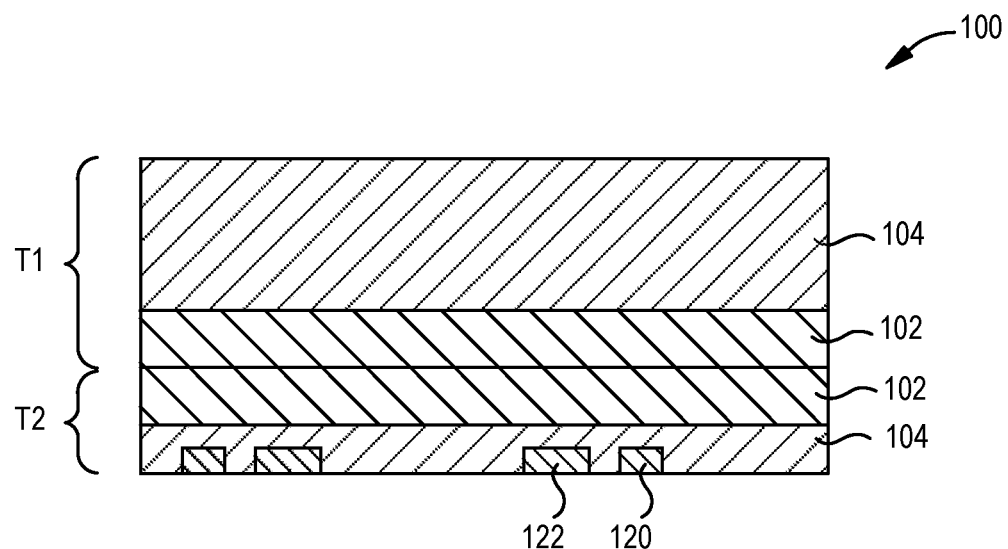

FIG. 3C is a cross-sectional view of the bonded substrates 100 including stressed material 122 deposited into the trenches 120 of the semiconductor substrate 104 of substrate T2. After the trenches 120 are etched into the semiconductor substrate 104, a stressed material 122 is deposited into the trenches 120. The stressed material 122 can be deposited by any technique for depositing a stressed material (e.g., a chemical vapor deposition (CVD) process). In some examples, the stressed material 122 can be planarized (e.g., by CMP) to be co-planar with the backside surface of the semiconductor substrate 104, such as illustrated in FIG. 3C. The stressed material 122 can be or cause compressive or tensile stress. Examples of stressed material 122 can include silicon nitride, copper, and/or silicon oxide. In some examples, the stressed material 122 can be deposited at a low temperature.

In some examples, the stressed material 122 has a CTE that is different from the CTE of the semiconductor substrate 104. In such examples, the stressed material 122 has a CTE that is greater than the CTE of the semiconductor substrate 104. In other examples, the stressed material 122 has a CTE that is less than the CTE of the semiconductor substrate 104. Table 1 below illustrates example stressed materials and corresponding CTEs:

TABLE 1

| Material | CTE (ppm/C) |
| --- | --- |
| Cu | 17 |
| $SiO_2$ | 5.6 $10^{-7}$/K |
| $Si_3N_4$ | 2.8-3.3 |

In some examples, a material of intrinsic stress can be formed in the trenches 120 (e.g., a material having a different lattice constant compared to the semiconductor substrate 104). Table 2 below illustrates example materials of different lattice constants:

TABLE 2

| Material | Lattice constant (A) | Crystal structure |
| --- | --- | --- |
| Si | 5.431 | Face-centered cubic (FCC) |
| C (Diamond) | 3.567 | FCC |
| C (Graphite) | a = 2.461 | Hexagonal |
|  | c = 6.708 |  |
| Ge | 5.658 | FCC |
| GaAs | 5.653 | FCC |
| SiC | a = 3.086 | Wurtzite |
|  | c = 10.053 |  |
| InP | 5.869 | FCC |
| InAs | 6.0583 | FCC |

In some examples, any combination of the stressed materials can be deposited into the trenches in order to reduce warpage. The choice of stressed material to deposit into the trenches 120 depends on the warpage of the bonded substrates 100 or of the individual substrate T2. If the substrate T2 is expected to have a concave warpage (as shown in FIG. 2), a compressive stressed material can be formed in the trenches 120. If the substrate T2 is expected to have a convex warpage (as shown in FIG. 2), a tensile stressed material can be formed in the trenches 120. Further, for areas with greater amounts of warpage, a more tensile or more compressive material can be deposited, as compared to areas with lesser amounts of warpage where a less tensile or less compressive material can be deposited. Even further, if the bonded substrates 100 can have a combination of concave and convex warpage, a combination of tensile and compressive stressed materials can be deposited into the trenches 120 (e.g., multiple etch and deposition processes can be performed to form compressive stressed material in a first subset of trenches and to form tensile stressed material in a second subset of trenches).

Figure 3D:
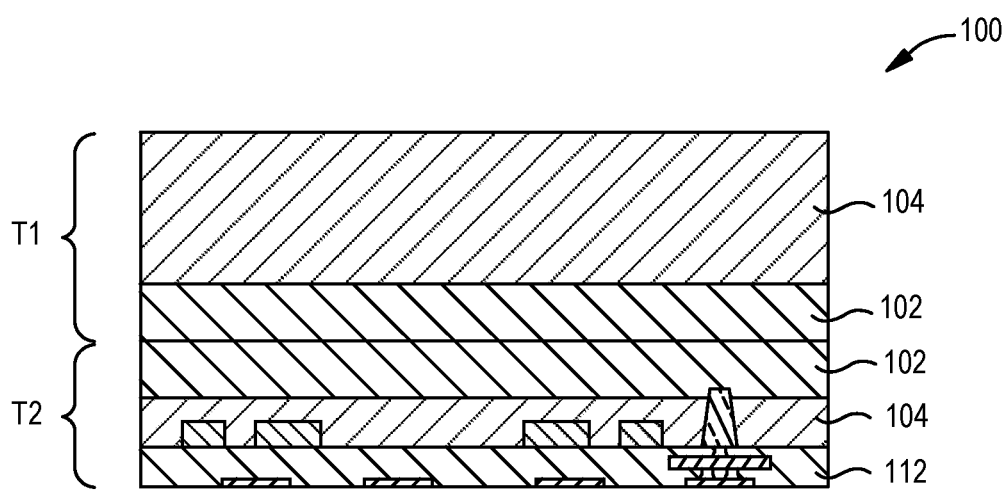

FIG. 3D is a cross-sectional view of the bonded substrates 100 illustrating at least some backside interconnect processes on the substrate T2. After stressed material 122 is formed in the trenches 120 of the semiconductor substrate 104 of substrate T2, backside interconnect processes are performed on the substrate T2. Backside interconnect processes can include backside through-substrate via (BTSV) etching, BTSV metal depositions, BTSV CMP, backside dielectric deposition, backside via (BVz) and backside metal (BMz) patterning in the backside dielectric, and BVz and BMz depositions. For one or, in some instances, more dies, a backside interconnect process can include backside redistribution layer (RDL) via (RVB) patterning, RVB metal depositions, aligned pillar bonding (APB) patterning, APB depositions, top dielectric layer opening (CB2) patterning, C4 bump or uBump, etc.

Figure 4A:
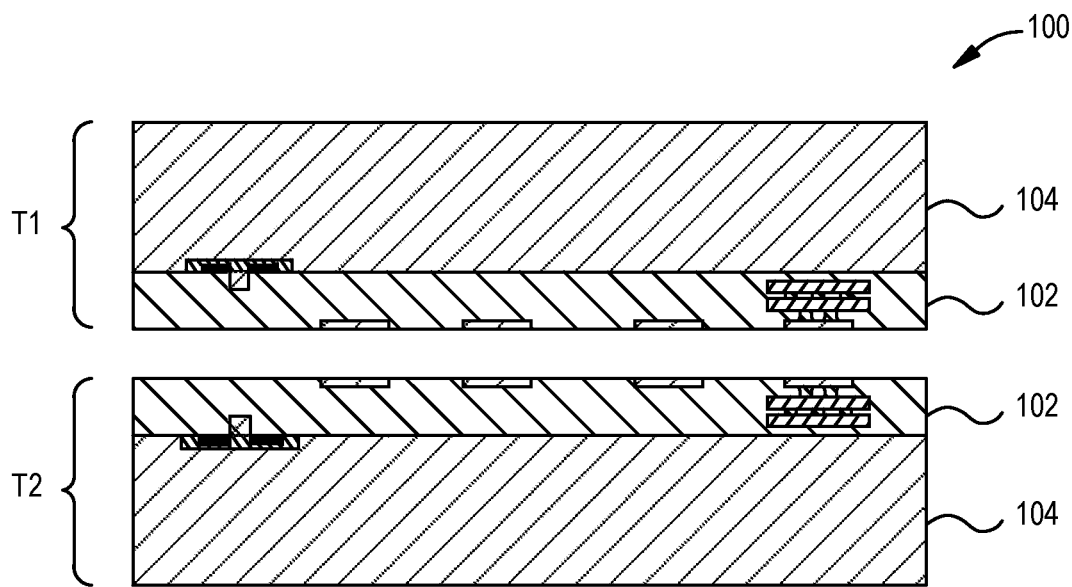
FIGS. 4A-4Q are cross-sectional views of processing of bonded substrates, according to some examples.
Figure 4B:
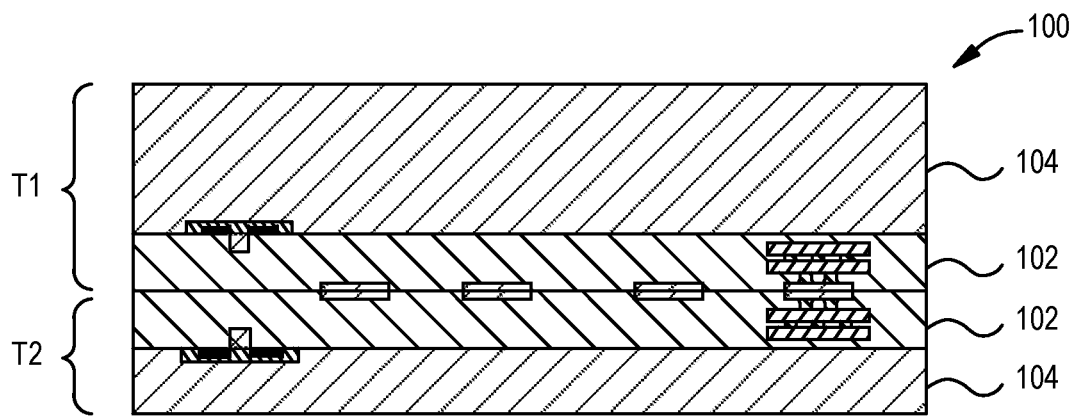
Figure 4C:
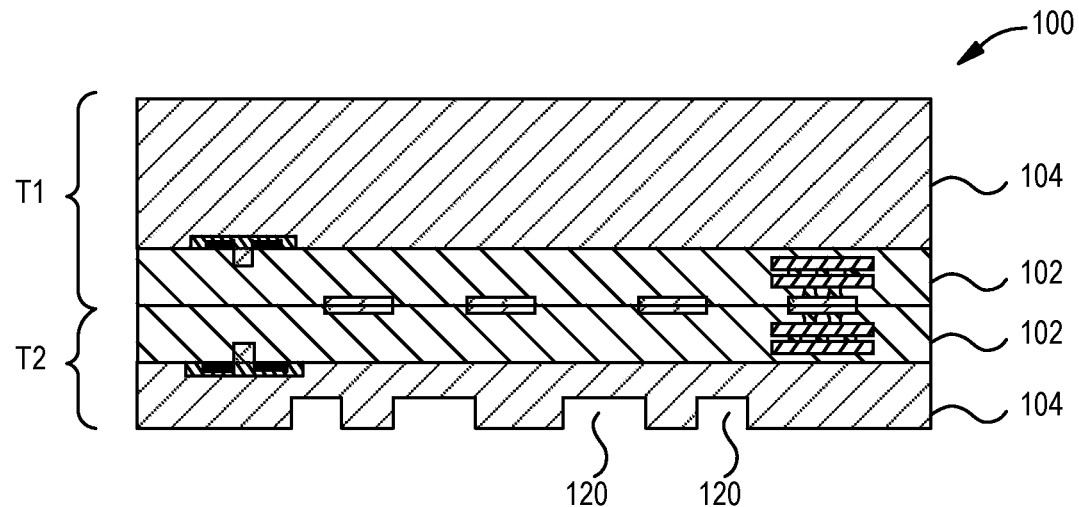
Figure 4D:
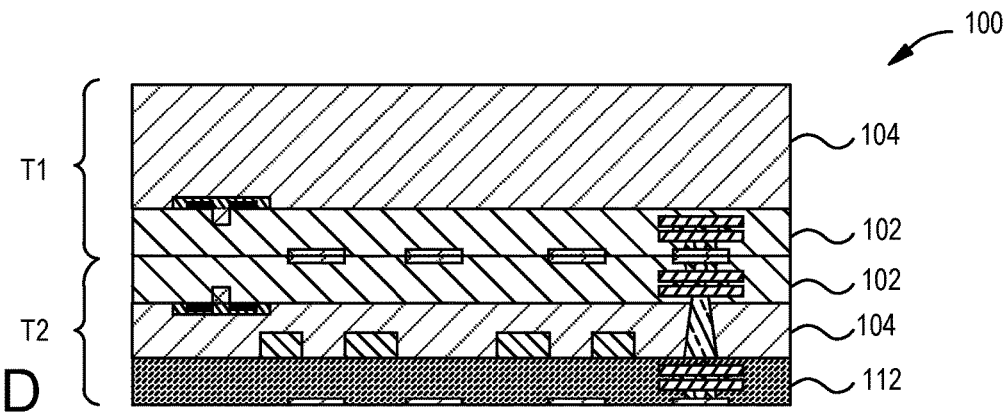
Figure 4E:
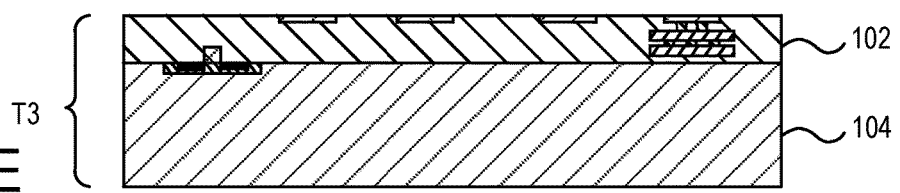
Figure 4F:
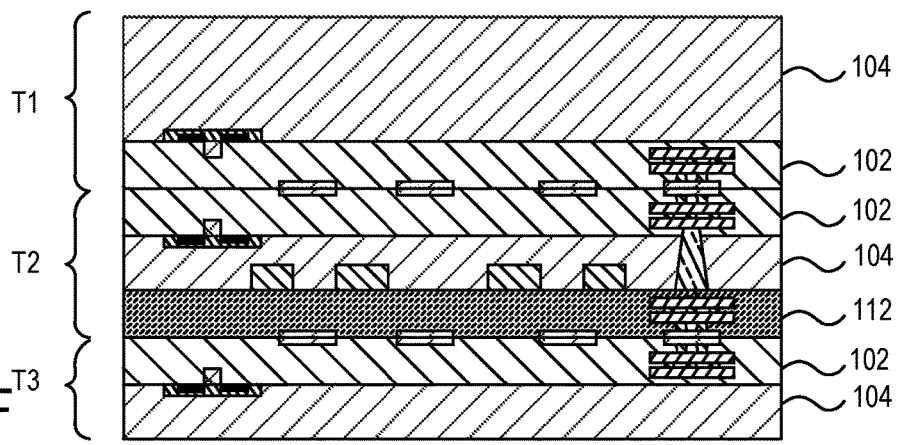
Figure 4G:
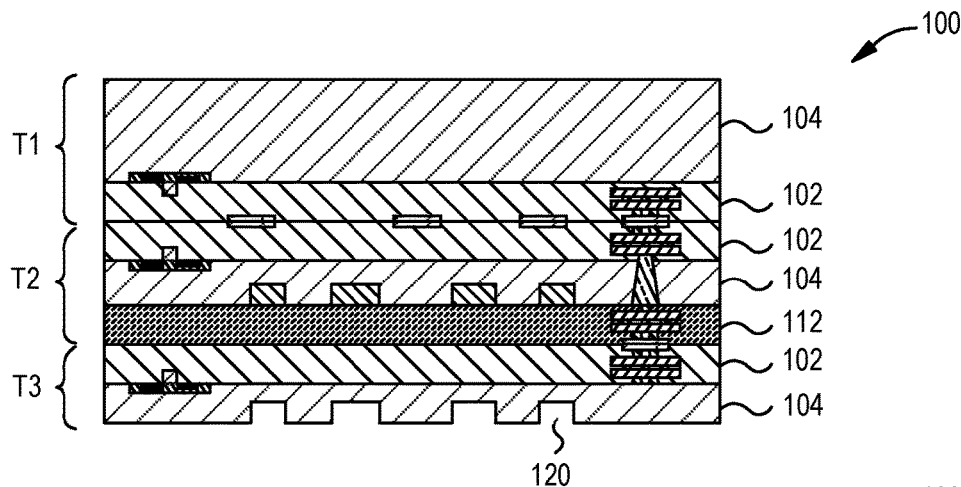
Figure 4H:
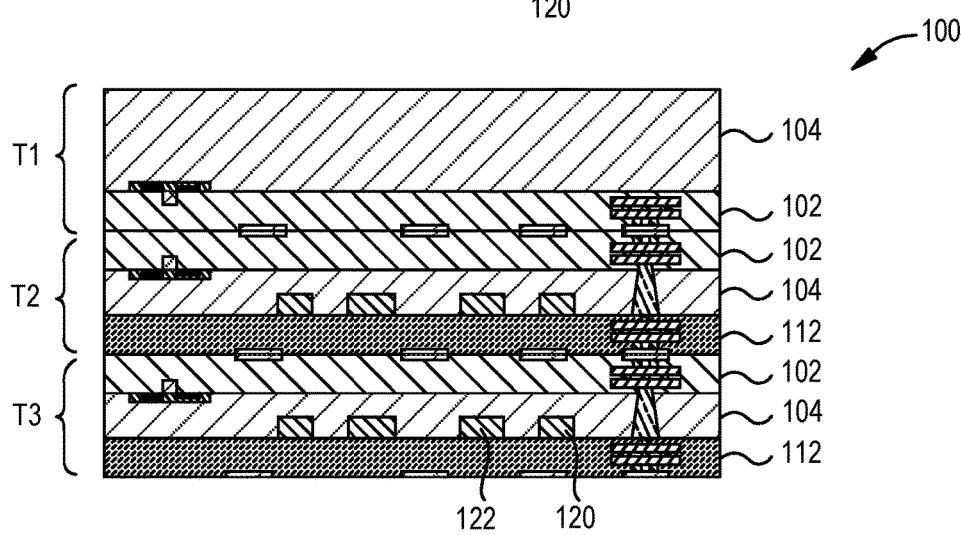
Figure 4I:
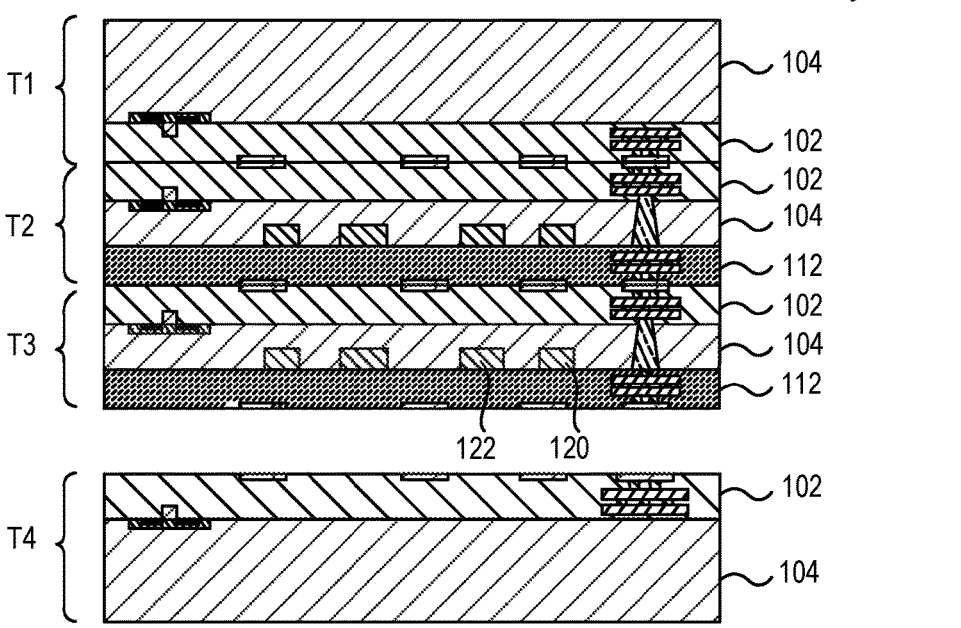
Figure 4J:
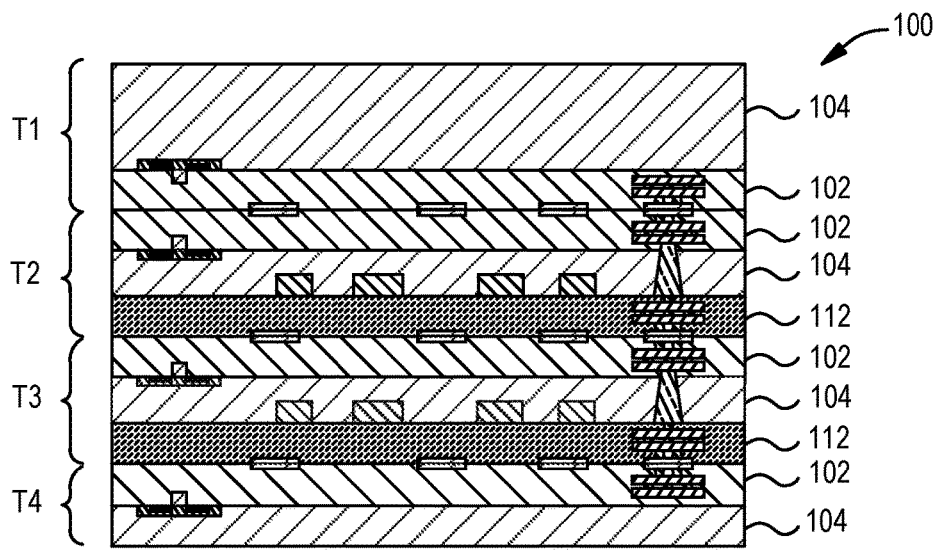
Figure 4K:
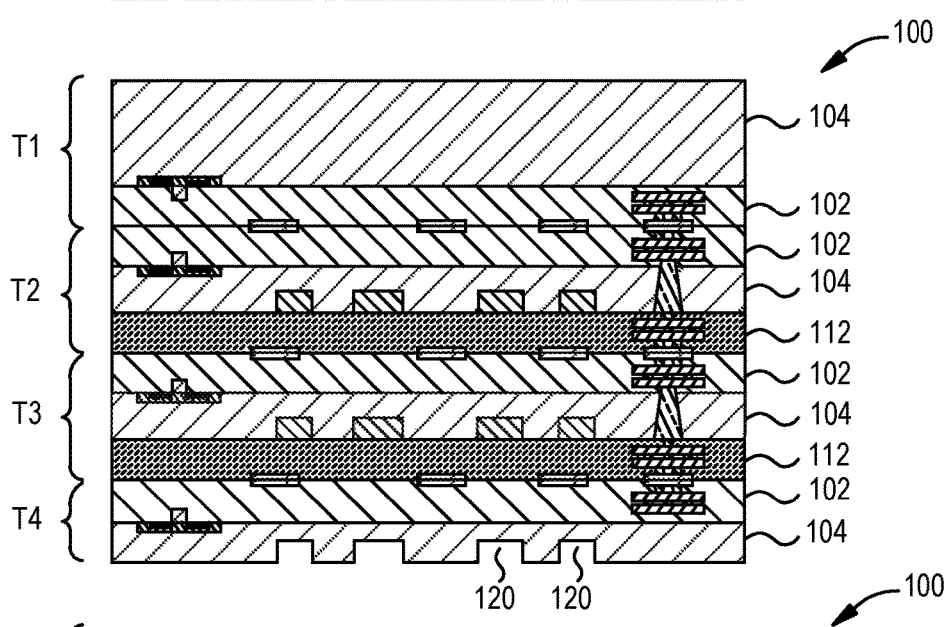
Figure 4L:
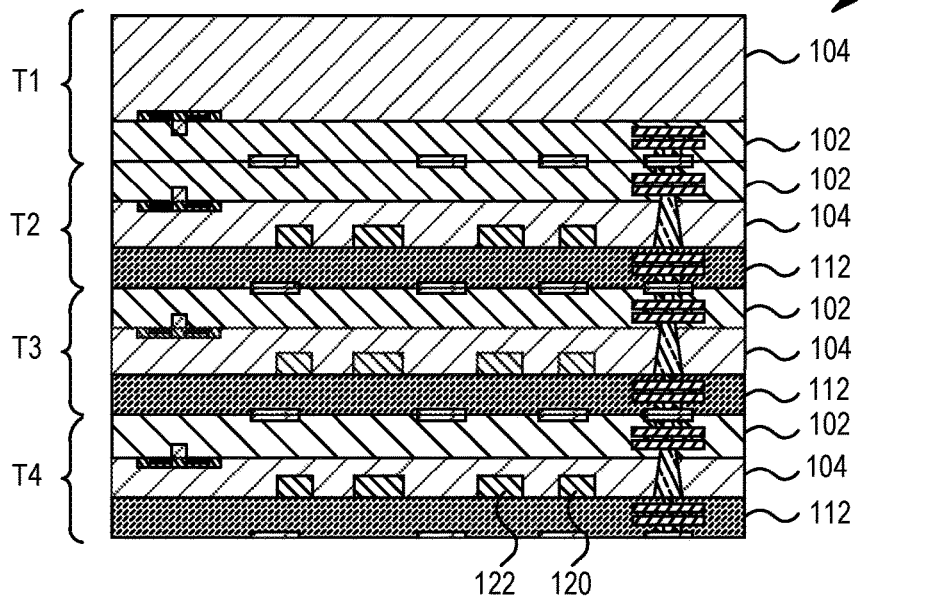
Figure 4M:
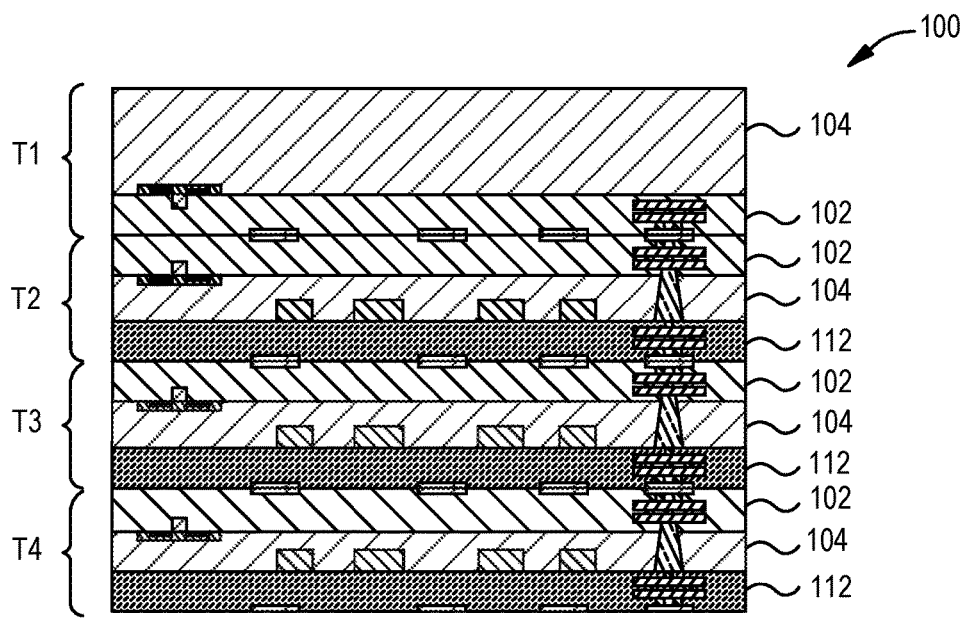
Figure 4N:
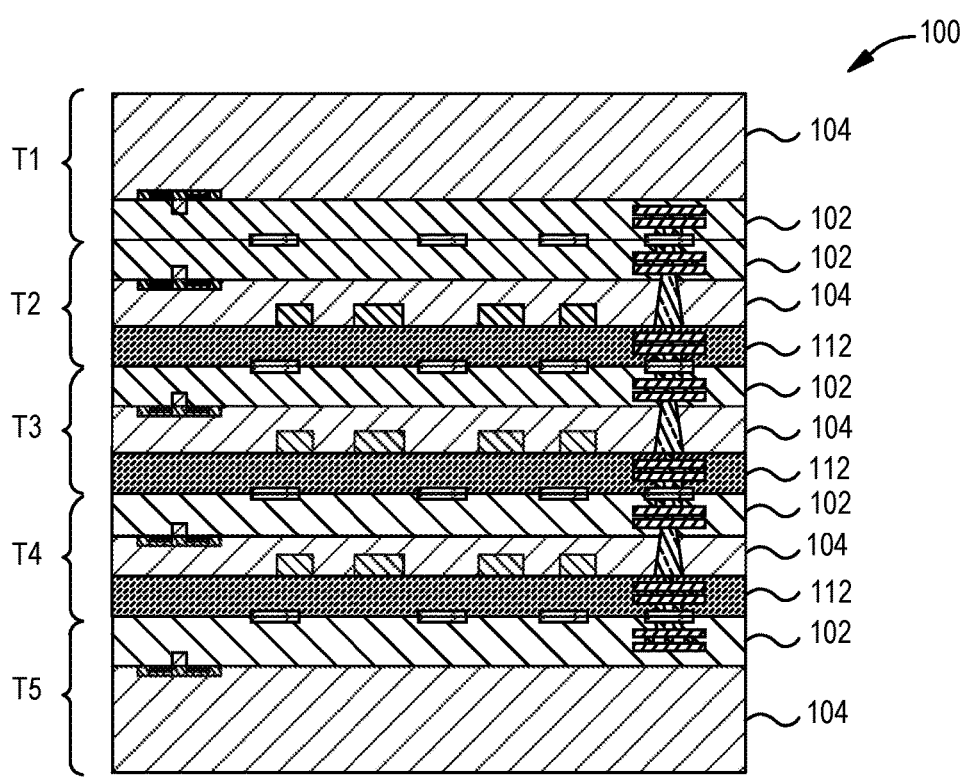
Figure 4O:
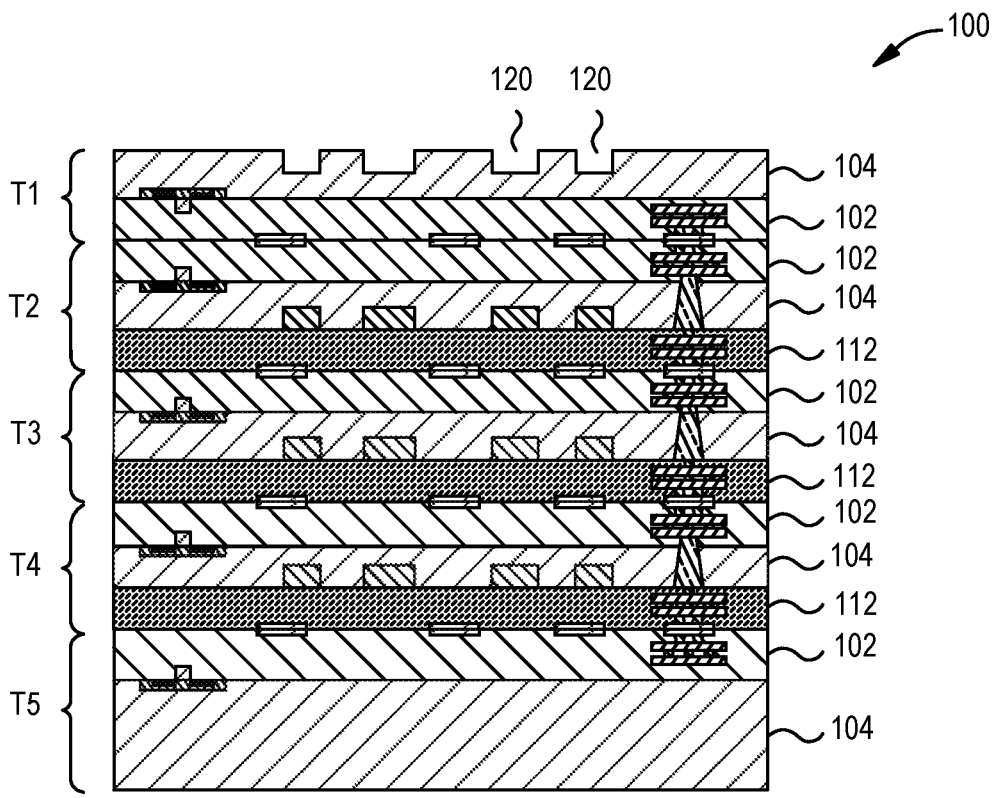
Figure 4P:
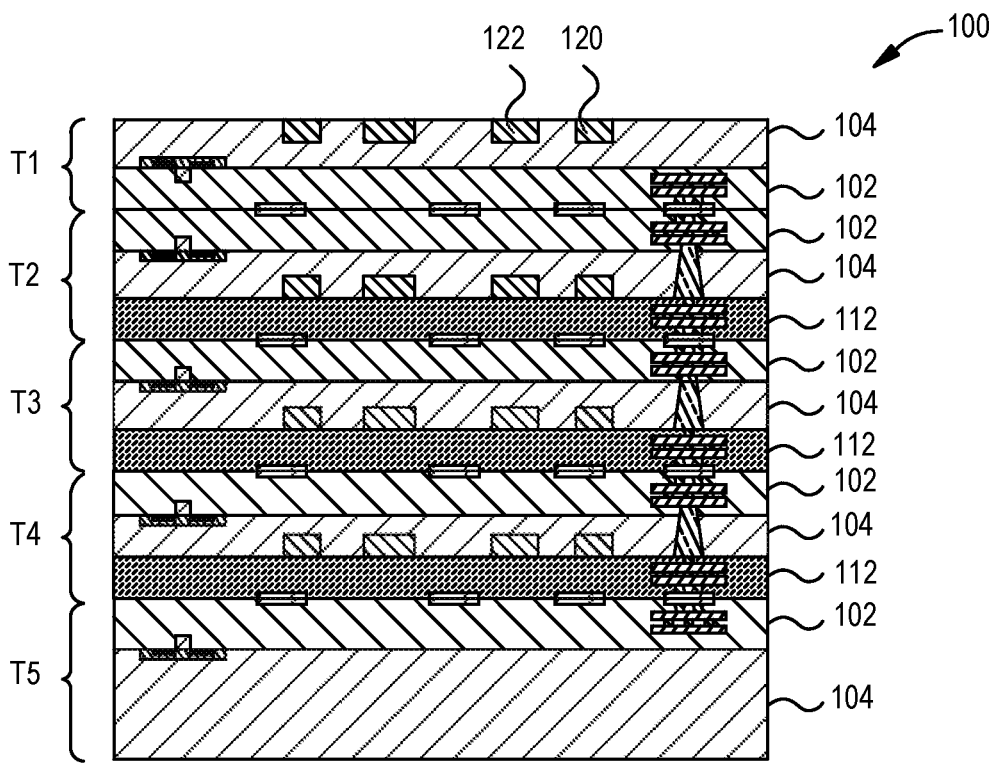
Figure 4Q:
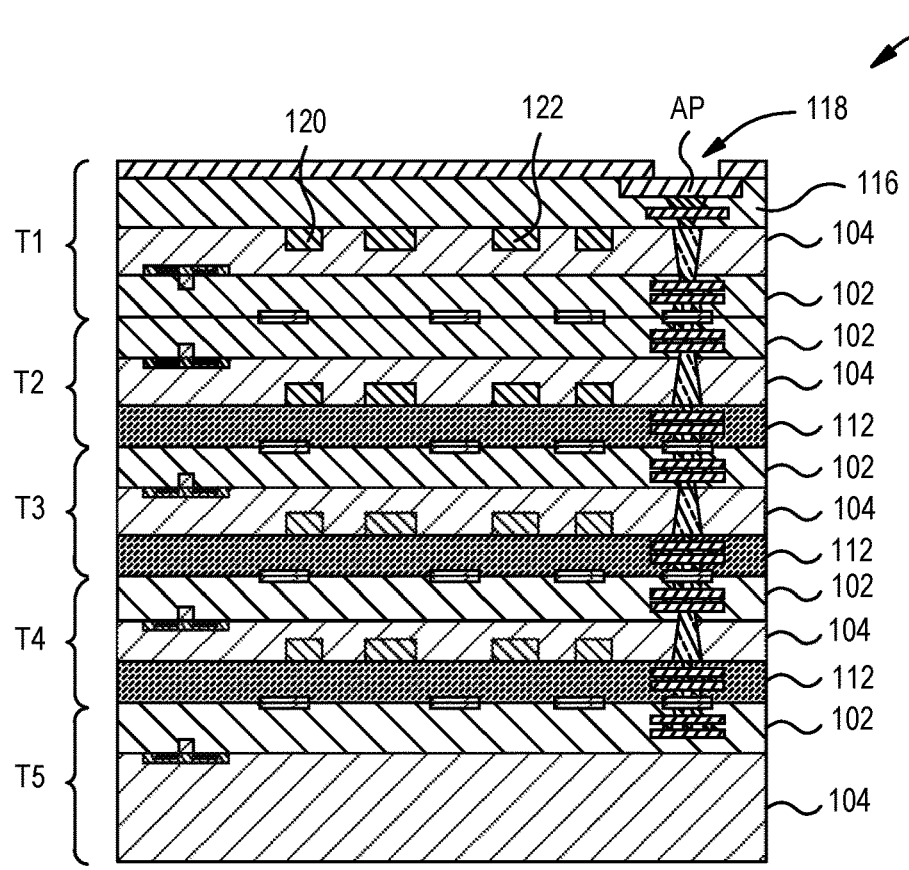

FIGS. 4A-4Q are cross-sectional views of bonded substrates 100 constructed according to the warpage reduction technique of FIG. 3A-3D, according to some examples. Specifically, FIGS. 4A-4Q illustrates the construction of the bonded substrates 100 illustrated in FIG. 1 using the warpage reduction techniques of FIGS. 3A-3D for multiple substrates.

FIG. 4A is a cross-sectional view of two substrates T1 and T2 being bonded together. In some examples, the two substrates are bonded via hybrid bonding.

FIG. 4B is a cross-sectional view of the bonded substrates 100 after the semiconductor substrate 104 of substrate T2 has been thinned, corresponding to FIG. 3A.

FIG. 4C is a cross-sectional view of the bonded substrates 100 after trenches 120 are etched into the thinned semiconductor substrate 104 of substrate T2, corresponding to FIG. 3B.

FIG. 4D is a cross-sectional view of the bonded substrates 100 after stressed material 122 has been formed in the trenches 120 of the thinned semiconductor substrate 104 of substrate T2, corresponding to FIG. 3C. As mentioned previously, after stressed materials have been formed in the trenches 120 of the thinned semiconductor substrate, backside interconnect processes can be performed on substrate T2, as illustrated with FIG. 3D.

FIG. 4E through FIG. 4H are cross-sectional views of the bonded substrates 100 repeating the warpage reduction technique on substrate T3. Similarly, FIG. 4I through FIG. 4L are cross-sectional views of the bonded substrates 100 repeating the warpage reduction technique on substrate T4. These FIGS. 4E-4L illustrate repetitions of the warpage reduction techniques, as shown in FIG. 4B through 4D, for substrate T3 (e.g., FIGS. 4E-4H) and substrate T4 (e.g., FIGS. 4I-4L).

FIG. 4M is a cross-sectional view of the substrate T5 being bonded to substrate T4 of the bonded substrates 100. Similar to the other substrate T1-T4, substrate T5 can be bonded to substrate T4 using hybrid bonding. Other types of bonding can also be used to bond substrate T5 to the backside of substrate T4. In some examples, no additional substrate layers are added after substrate T5. In some examples, semiconductor substrate 104 of substrate T5 retains its thickness.

FIG. 4N is a cross-sectional view of the bonded substrates 100 after the semiconductor substrate 104 of substrate T1 has been thinned. In some examples, after substrate T5 has been bonded to the bonded substrates 100, the semiconductor substrate 104 of substrate T1 is thinned.

FIG. 4O is a cross-sectional view of the bonded substrates 100 after trenches are etched into the thinned semiconductor substrate 104 of substrate T1. Like with the other substrates T2-T4, substrate T1 may also be subject to warpage after thinning its semiconductor substrate 104. Accordingly, trenches 120 are etched into the thinned semiconductor substrate 104 of substrate T1, according to the warpage reduction techniques disclosed herein. Because of the orientation of substrate T1, the trenches 120 can be etched into the side of the semiconductor substrate 104 of substrate T1 opposite of the substrate T2.

FIG. 4P is a cross-sectional view of the bonded substrates 100 after stressed materials have been deposited into the trenches 120 of the thinned semiconductor substrate 104 of substrate T1.

FIG. 4Q is a cross-sectional view of the bonded substrates 100 after a layer 124 is bonded to the substrate T1. After the stressed materials have been deposited into the trenches 120 of the thinned semiconductor substrate 104 of substrate T1, a layer 124 is formed on the substrate T1. The layer 124 can comprise one or more backside dielectric layers 116 and/or backside pads 118 of FIG. 1.

Figure 5:
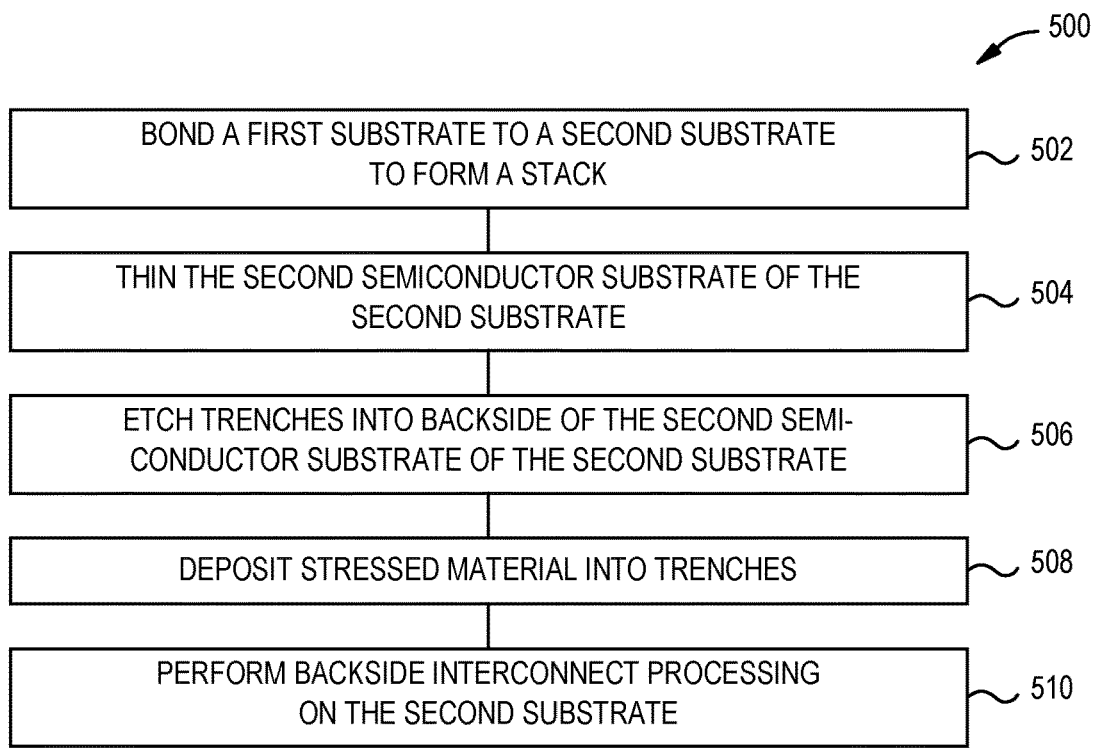
FIG. 5 is a flow chart of a warpage reduction technique, according to some examples.

FIG. 5 is a flow chart of example operations 500 for fabricating bonded substrates 100 using the warpage reduction techniques shown in FIG. 4A-4Q, in accordance with an example of the present disclosure. The operations may begin, at block 502, by bonding a first substrate (e.g., substrate T1) to a second substrate (e.g., substrate T2) to form a stack (e.g., bonded substrates 100). In some examples, the first substrate includes an IO die. At block 504, the second semiconductor substrate 104 (e.g., semiconductor substrate 104 of T2) of the second substrate is thinned. At block 506, trenches (e.g., trenches 120 of semiconductor substrate 104 of substrate T2) are etched into the backside of the thinned semiconductor substrate of the second substrate. At block 508, a stressed material (e.g., stressed material 122) is deposited into the trenches. The stressed material can be tensile or compressive. At block 510, backside interconnect processing is performed on the second substrate.

In some examples, operations 500 continue with bonding a third substrate to the stack, the third substrate comprising a third semiconductor substrate, and thinning the third semiconductor substrate. In further examples, trenches are etched into the thinned third semiconductor substrate and stressed material is deposited into the trenches of the thinned third semiconductor substrate. In other examples, a stressed film is deposited on a backside surface of the third substrate.

In some examples, operations 500 continue with performing backside interconnect processing on the thinned second semiconductor substrate.

In some examples, operations 500 continue with thinning the first semiconductor substrate of the first substrate, etching trenches into the thinned first semiconductor substrate, and depositing a stressed material into the trenches of the thinned first semiconductor.

Figure 6A:
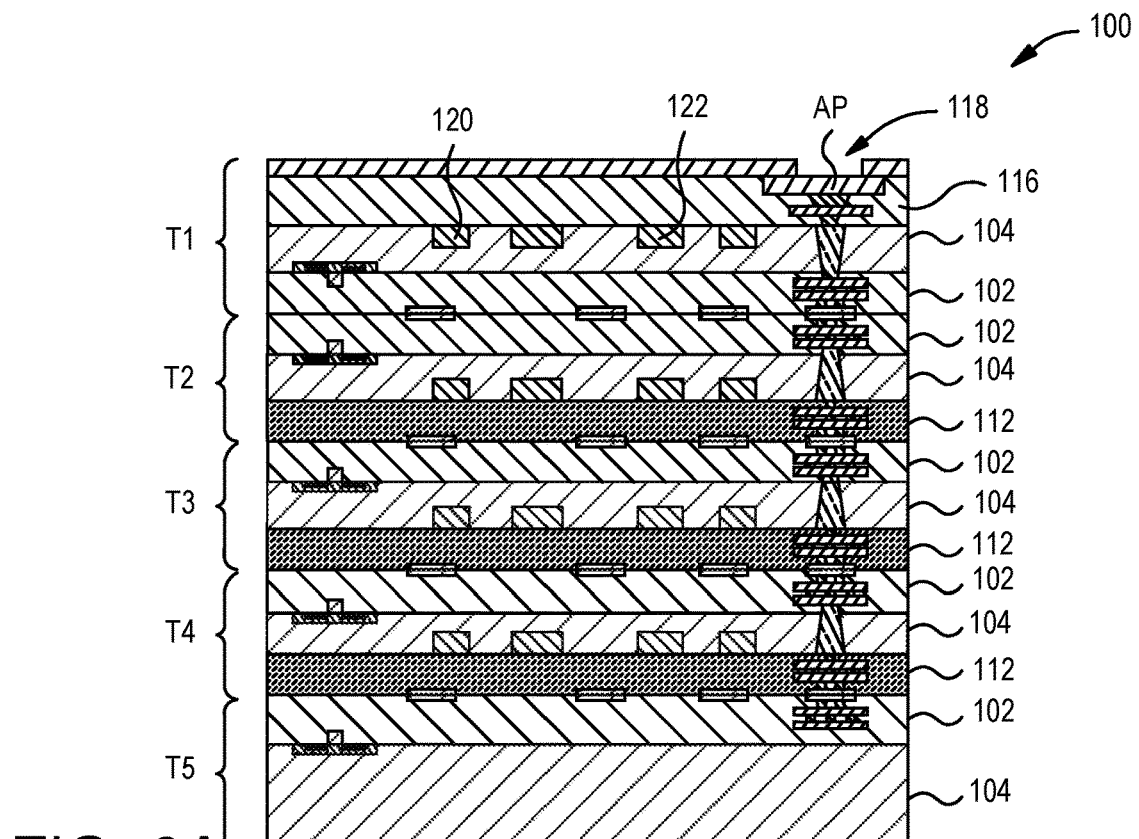
FIGS. 6A-6B are cross-sectional views of bonded substrates, according to some examples.
Figure 6B:
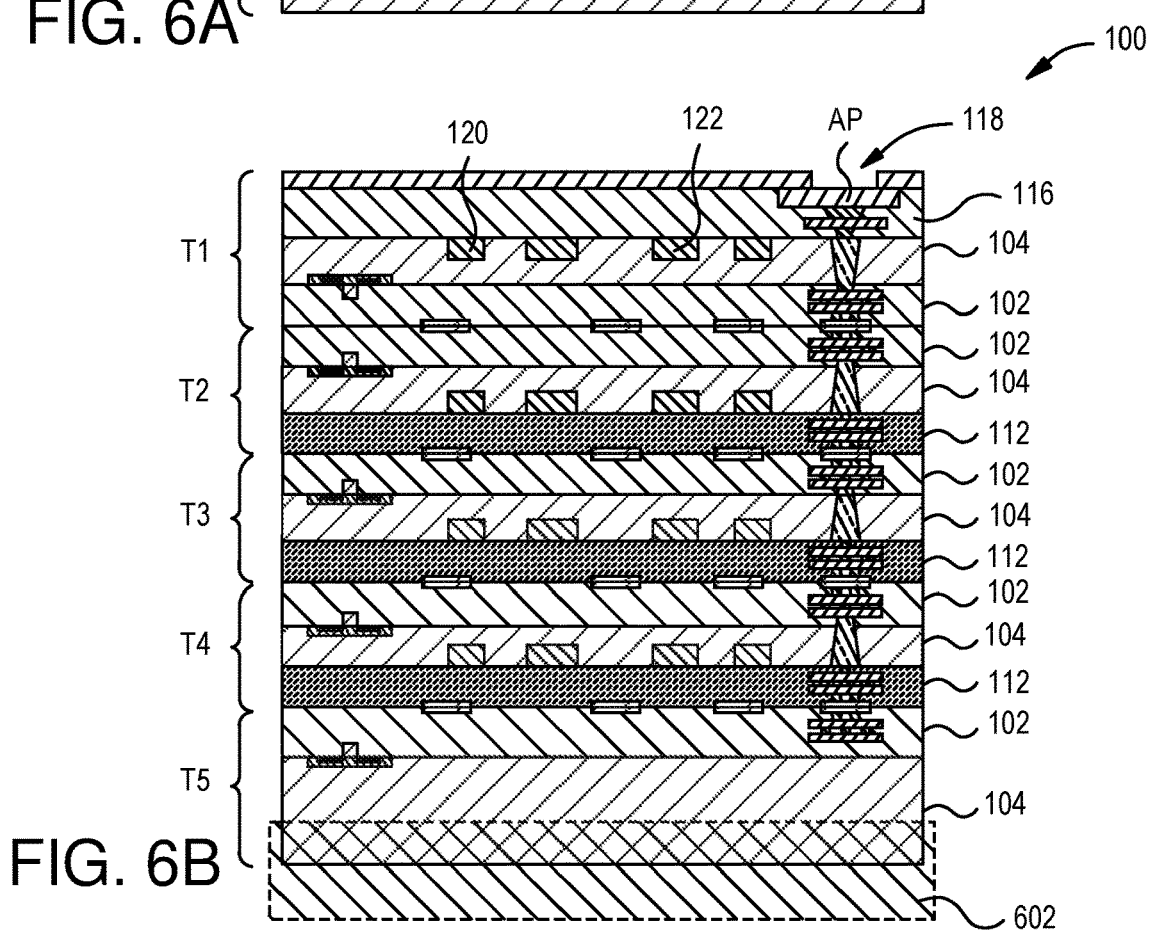

FIGS. 6A-6B are cross-sectional views of bonded substrates 100, according to some examples. The bonded substrates 100 are constructed according to the warpage reduction techniques disclosed herein (e.g., FIGS. 4A-4Q). In some examples, the bonded substrates 100 of FIGS. 6A-6B are the bonded substrates 100 of FIG. 4Q after the layer 124 has been formed on the substrate T1.

FIG. 6A is a cross-sectional view of a bonded substrates 100 including stressed material in trenches in some of its layers. In some examples, even after construction of the bonded substrates 100 using the warpage reduction techniques as disclosed in FIG. 3-5, the bonded substrates 100 can still be warped. In some examples, the semiconductor substrate 104 of substrate T5 can be thinned, or parts thereof can be removed.

FIG. 6B is a cross-sectional view of a bonded substrates 100 illustrating that semiconductor substrate 104 of substrate T5 can be thinned or removed, and a stressed film 602 can be deposited on the backside of the semiconductor substrate 104 of substrate T5. The material of the stressed film 602 can be silicon nitride, silicon carbide, or any other stressed material. The stressed film 602 can be compressively or tensilely stressed. The stressed film can have residual stress dependent on the temperature of deposition, growth mechanism, and deposition method. In some examples, the stressed film 602 comprises plasma-enhanced CVD (PECVD) deposited silicon nitride, and the stressed film 602 can be modulated from compressive stress (−1.2 GPa) to tensile stress (1 GPa) by different process conditions.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:

1. A method of stacking semiconductor substrates, the method comprising:
    bonding a first substrate with a second substrate to form a stack, the first substrate comprising a first semiconductor substrate, and the second substrate comprising a second semiconductor substrate;
    thinning the bonded second semiconductor substrate of the stack;
    etching a first trench into a backside of the thinned bonded second semiconductor substrate on the thinned bonded second semiconductor substrate;
    depositing a first stressed material into the first trench on the thinned bonded second semiconductor substrate;
    bonding a third substrate to the stack, the third substrate comprising a third semiconductor substrate, wherein a top surface of the third substrate is bonded to a backside interconnect processed surface of the second substrate; and thinning the bonded third semiconductor substrate.

2. The method of claim 1, further comprising:
depositing a stressed film on a backside surface of the third substrate on the thinned bonded third semiconductor substrate.

3. The method of claim 1, further comprising:
etching third trenches into the thinned third semiconductor substrate on the thinned bonded third semiconductor substrate; and
depositing a second stressed material into the third trenches on the thinned bonded third semiconductor substrate.

4. The method of claim 1, further comprising: performing the backside interconnect processing on the thinned bonded second semiconductor substrate having the first stressed material deposited in the first trench, wherein thinning the bonded second semiconductor substrate is performed from a backside of the bonded second semiconductor substrate.

5. The method of claim 1, further comprising:
thinning the bonded first semiconductor substrate of the stack;
etching a second trench into the thinned bonded first semiconductor substrate; and
depositing a second stressed material into the second trench.

6. The method of claim 1, wherein a coefficient of thermal expansion (CTE) of the second semiconductor substrate is greater than the CTE of the first stressed material.

7. The method of claim 1, wherein a coefficient of thermal expansion (CTE) of the second semiconductor substrate is less than the CTE of the first stressed material.

8. The method of claim 1, wherein etching the first trench into the backside of the thinned bonded second semiconductor substrate comprises wet-etching.

9. The method of claim 1, wherein etching the first trench into the backside of the thinned bonded second semiconductor substrate comprises dry etching.

10. A method of manufacturing a device, the method comprising:
bonding a first substrate with a second substrate to form a stack, each substrate of the stack comprising a dielectric layer and a semiconductor substrate layer;
etching a plurality of trenches into a backside of the semiconductor substrate layer of the second substrate of the stack, a height of each of the plurality of trenches less than a height of the semiconductor substrate layer of the second substrate; and
depositing stressed materials into the plurality of trenches, wherein a surface of each of the stressed materials is flush with the backside of the semiconductor substrate;
performing backside interconnect processing on the backside of the semiconductor substrate layer of the second substrate, the backside included includes the stressed materials deposited into the plurality of trenches of the backside of the semiconductor substrate layer of the second substrate;
bonding a third substrate to the stack, the third substrate comprising a dielectric layer and a semiconductor substrate layer, wherein the dielectric layer of the third substrate is bonded to a backside interconnect processed surface of the second substrate; and
depositing a stressed film on a backside surface of the third substrate.

11. The method of claim 10, wherein the dielectric layer of the first substrate is bonded to the dielectric layer of the second substrate.

12. The method of claim 10, further comprising:
bonding a third substrate to the stack, the third substrate comprising a dielectric layer and a semiconductor substrate layer, wherein the dielectric layer of the third substrate is bonded to a backside interconnect processed surface of the second substrate;
etching a second plurality of trenches into the semiconductor substrate layer of the third substrate, wherein a height of each of the second plurality of trenches is less than a height of the semiconductor substrate layer of the third substrate;
depositing second stressed materials into the second plurality of trenches, wherein a surface of the second stressed materials is flush with the backside of the semiconductor substrate of the third substrate; and
performing backside interconnect processing on the backside of the semiconductor substrate layer of the third substrate, the backside including the second stressed materials deposited into the second plurality of trenches of the backside of the semiconductor substrate layer of the third substrate.

13. The method of claim 10, further comprising:
thinning the semiconductor substrate layer of each substrate of the stack prior to performing the backside interconnect processing on the backside of the semiconductor substrate layer of each respective substrate.

14. The method of claim 10, wherein the stressed materials comprises at least one tensile stressed material and at least one compressive stressed material.

15. The method of claim 10, wherein the stressed materials comprises a tensile stressed material having a coefficient of thermal expansion (CTE) less than the CTE of the semiconductor substrate layer of the second substrate.

16. The method of claim 10, wherein the stressed materials comprises a compressive stressed material a coefficient of thermal expansion (CTE) greater than the CTE of the semiconductor substrate layer of the second substrate.

17. The method of claim 10, wherein etching the plurality of trenches into the backside of the second substrate comprises one of wet-etching or dry etching.

18. The method of claim 10, further comprising:
etching a second plurality of trenches into the semiconductor substrate layer of the first substrate, wherein a height of each of the second plurality of trenches is less than a height of the semiconductor substrate layer of the first substrate;
depositing second stressed materials into the second plurality of trenches, wherein a surface of the second stressed materials is flush with the backside of the semiconductor substrate of the first substrate; and
performing backside interconnect processing on the backside of the semiconductor substrate layer of the first substrate, the backside included the second stressed materials deposited into the second plurality of trenches of the backside of the semiconductor substrate layer of the first substrate.

19. A method of manufacturing a device, the method comprising:
bonding a first substrate with a second substrate to form a stack, each substrate of the stack comprising a dielectric layer and a semiconductor substrate layer;
etching a first plurality of trenches into a backside of the semiconductor substrate layer of the second substrate of the stack, a height of each of the plurality of trenches less than a height of the semiconductor substrate layer of the second substrate; and depositing stressed materials into the first plurality of trenches, wherein a surface of each of the stressed materials is flush with the backside of the semiconductor substrate;

performing backside interconnect processing on the backside of the semiconductor substrate layer of the second substrate, the backside includes the stressed materials deposited into the first plurality of trenches of the backside of the semiconductor substrate layer of the second substrate etching a second plurality of trenches into the semiconductor substrate layer of the first substrate, wherein a height of each of the second plurality of trenches is less than a height of the semiconductor substrate layer of the first substrate;

depositing second stressed materials into the second plurality of trenches, wherein a surface of the second stressed materials is flush with the backside of the semiconductor substrate of the first substrate; and performing backside interconnect processing on the backside of the semiconductor substrate layer of the first substrate, the backside included the second stressed materials deposited into the second plurality of trenches of the backside of the semiconductor substrate layer of the first substrate.

* * * * *

UNITED STATES PATENT AND TRADEMARK OFFICE
CERTIFICATE OF CORRECTION

PATENT NO. : 11,164,749 B1
APPLICATION NO. : 16/571766
DATED : November 2, 2021
INVENTOR(S) : Nui Chong and Hui-Wen Lin It is certified that error appears in the above-identified patent and that said Letters Patent is hereby corrected as shown below:

In the Claims

Column 9, Line 57, In Claim 10, delete "included includes" and insert -- includes --, therefor.

Signed and Sealed this
Twenty-sixth Day of April, 2022

Katherine Kelly Vidal
*Director of the United States Patent and Trademark Office*